United States Patent [19]
Takaya et al.

[11] Patent Number: 6,062,953
[45] Date of Patent: May 16, 2000

[54] WAFER POSITIONING METHOD AND APPARATUS

[75] Inventors: Jun Takaya; Kazumi Ikeda, both of Mitaka, Japan

[73] Assignee: Tokyo Seimitsu Co., Ltd., Tokyo, Japan

[21] Appl. No.: 09/042,803

[22] Filed: Mar. 17, 1998

[30] Foreign Application Priority Data

Mar. 18, 1997 [JP] Japan ................................. 9-064192

[51] Int. Cl.[7] .................................................. B24B 1/00
[52] U.S. Cl. ........................... 451/41; 451/398; 451/903
[58] Field of Search ........................... 451/398; 269/903, 269/289 MR

[56] References Cited

U.S. PATENT DOCUMENTS 5,352,249  10/1994  Vollaro ................................. 29/25.01
5,700,297  12/1997  Vollaro ................................. 29/25.01

*Primary Examiner*—David A. Scherbel
*Assistant Examiner*—Shantese McDonald
*Attorney, Agent, or Firm*—Nixon Peabody LLP; David S. Safran

[57] ABSTRACT

The peripheral edge of a wafer is cramped by four cramp rollers which are able to move forward and backward with respect to a reference point, and thereby, the center of the wafer is positioned at the reference point. Then, a notch pin, which is provided on a reference line, is pressed against the peripheral edge of the wafer, and the wafer is rotated about the reference point. Thereby, a notch on the wafer moves to the notch pin, and then, the notch pin fits into the notch. Thus, the wafer is positioned at a predetermined position.

1 Claim, 4 Drawing Sheets

F I G. 4 (a)
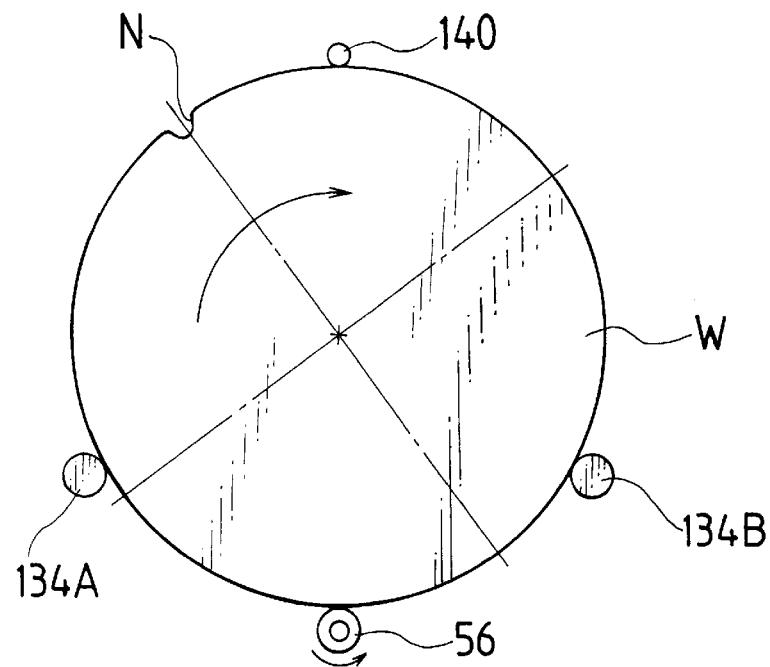
F I G. 4 (b)
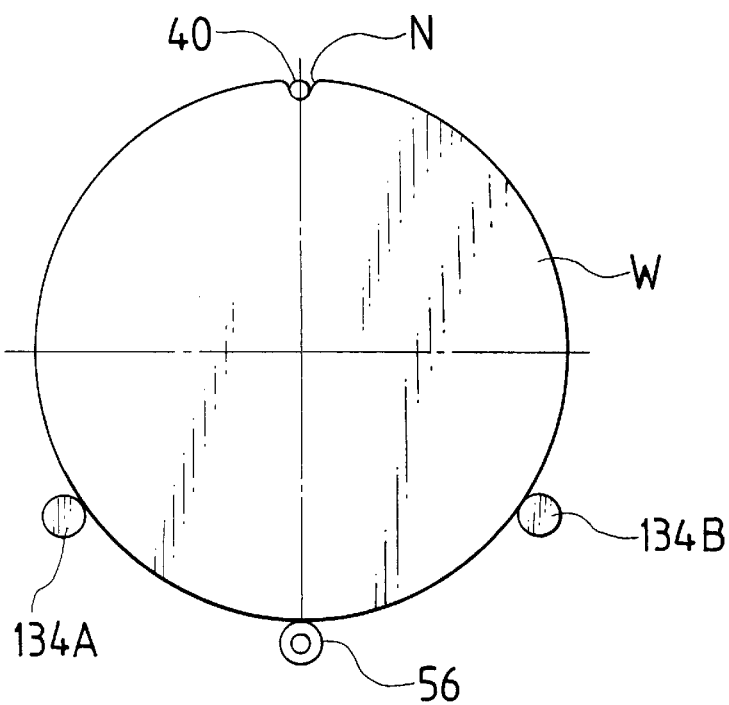

WAFER POSITIONING METHOD AND APPARATUS

BACKGROUND OF THE INVENTION

1. Field of the Invention

The present invention relates generally to a wafer positioning method and apparatus, and more particularly to a wafer positioning method and apparatus for a wafer with a notch.

2. Description of Related Art

An ingot such as silicon which is a material for semiconductor element is sliced into wafers by a cutting apparatus such as a slicing machine, and then the peripheral edge of the wafer is chamfered by a wafer chamfering apparatus.

In the wafer chamfering apparatus, the wafer is held on a rotary wafer table, and the peripheral edge of the rotating wafer is pressed against a rotating grinding wheel so that the wafer can be chamfered.

To accurately chamfer the wafer by the above-mentioned chamfering apparatus, the center of the wafer must correspond to and be fixed to the center of the wafer table when the wafer is mounted on the wafer table.

In the case of the wafer with the notch, the wafer must be fixed so that the notch can be positioned in a predetermined direction.

For this reason, the wafer chamfering machine is usually provided with a wafer positioning apparatus. The wafer is positioned by the wafer positioning apparatus, and it is fixed on the wafer table.

The conventional wafer positioning apparatus, however, has a disadvantage described below. It is unable to automatically position the notch, although it is able to automatically position the center of the wafer. Hence, a pre-alignment apparatus must be additionally provided to set the position of the notch.

If the pre-alignment apparatus does not correctly set the notch or if the notch is displaced during transportation of the wafer, the wafer is fixed on the wafer table with the notch being displaced. Thereby, the wafer cannot be chamfered accurately.

SUMMARY OF THE INVENTION

The present invention has been developed in view of the above-described circumstances, has as its object the provision of the wafer positioning method and apparatus which accurately positions the wafer with the notch.

To achieve the above-mentioned object, a wafer positioning method of the present invention which positions a wafer such that the center of the wafer is at a predetermined reference point and a notch, formed on the wafer, is in a predetermined reference direction, comprises the steps of: cramping the peripheral edge of the wafer with a plurality of cramp rollers, arranged on a circle of which center is at the reference point, to position the center of the wafer at the reference point; and pressing a notch pin, arranged in the reference direction, against the peripheral edge of the wafer and rotating the wafer about the reference point, thereby fitting the notch pin into the notch of the wafer to position the notch in the reference direction.

According to the present invention, the wafer is positioned as described below. First, the cramp rollers cramp the wafer so that the center of the wafer can be positioned at the predetermined reference point. Then, the notch pin is pressed against the peripheral edge of the cramped wafer. Unlike the conventional method, the wafer is not positioned in the direction of the notch before it is cramped by the cramp rollers, and thus, the notch pin does not fit into the notch of the wafer at this time (the notch pin may accidentally fit into the notch.) If the notch pin does not fit into the notch, the cramped wafer is rotated about the reference point. Thereby, the notch moves in the direction of the notch pin, and the notch is coupled with the notch pin. Consequently, the center of the wafer is positioned at the reference point, and the notch is positioned in the reference direction so that the wafer can be positioned.

To achieve the above-mentioned object, a wafer positioning method of the present invention which positions a wafer such that the center of the wafer is on a predetermined reference line and a notch, formed on the wafer, is at a predetermined reference position, comprises the steps of: cramping the wafer with a notch pin, positioned at the reference position, and a pair of cramp rollers, which move symmetrically with respect to the reference line, to position the center of the wafer on the reference line; and rotating the cramped wafer about the center of a circle which is inscribed with the notch pin and the pair of cramped rollers, thereby fitting the notch pin into the notch of the wafer to position the notch at the reference position.

According to the present invention, the wafer is positioned as described below. First, the wafer is cramped by the notch pin positioned at the predetermined reference position and the pair of cramp rollers which move symmetrically with respect to the predetermined reference line. Thereby, the center of the wafer is positioned on the reference line. Then, the cramped wafer is rotated about the center of the inscribed circle of the notch pin and the pair of cramp rollers. Thereby, the notch moves in the direction of the notch pin, and the notch is coupled with the notch pin. Consequently, the center of the wafer is positioned on the reference line, and the notch is positioned at the reference position so that the wafer can be positioned.

BRIEF DESCRIPTION OF THE DRAWINGS

The nature of this invention, as well as other objects and advantages thereof, will be explained in the following with reference to the accompanying drawings, in which like reference characters designate the same or similar pares throughout the figures and wherein:

FIGS. 4(a) and 4(b) are views of assistance in explaining the operation of the second embodiment of the wafer positioning apparatus according to the present invention.

DETAILED DESCRIPTION OF THE PREFERRED EMBODIMENTS

This invention will be described in further detail by way of example with reference to the accompanying drawings.

Figure 1:
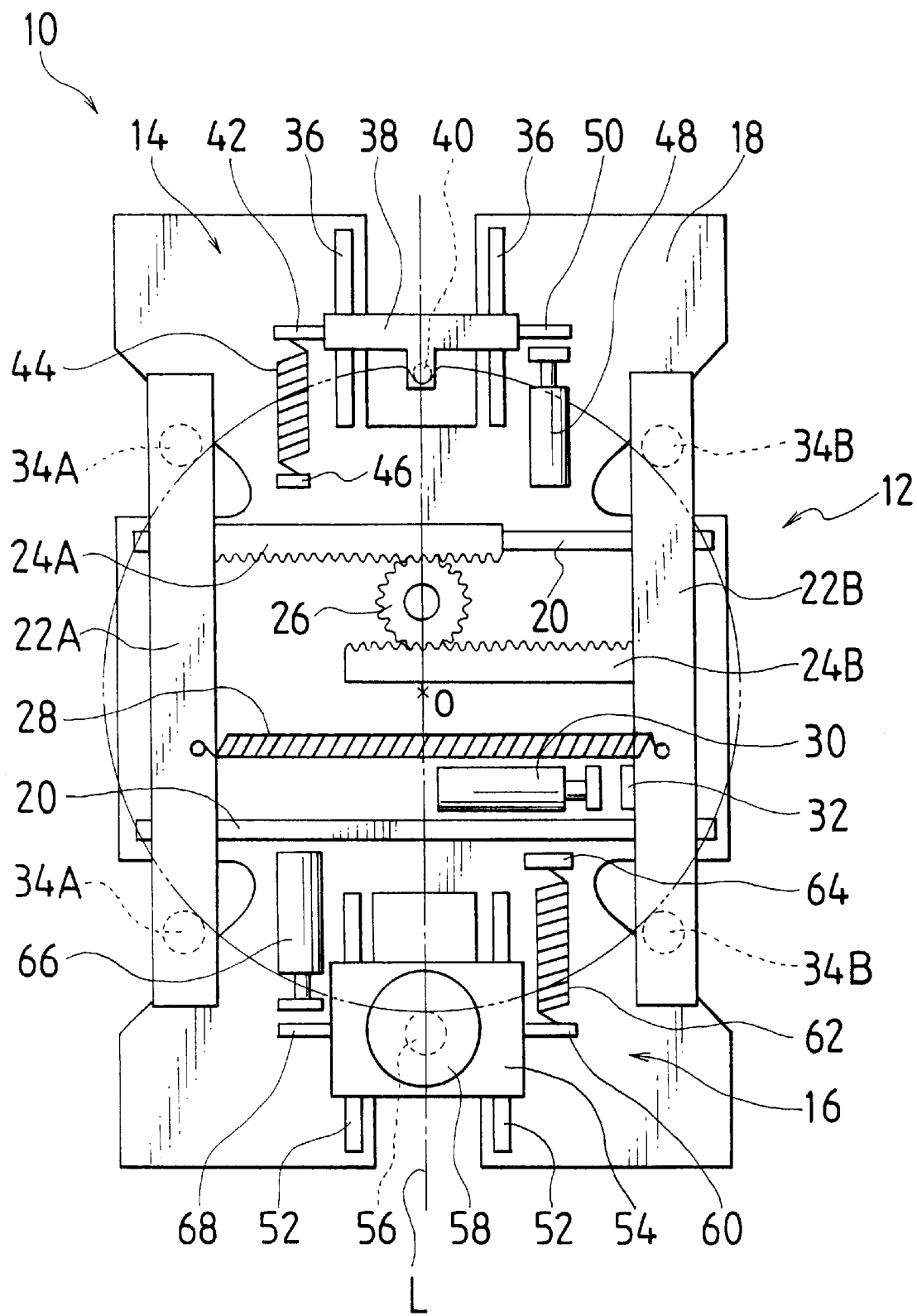
FIG. 1 is a plan view illustrating the first embodiment of the wafer positioning apparatus according to the present invention.

FIG. 1 is a plan view illustrating the construction of the first embodiment for a wafer positioning apparatus according to the present invention.

As shown in FIG. 1, the wafer positioning apparatus 10 comprises a centering unit 12 for centering a wafer W, a notch positioning unit 14 for positioning a notch N, which is formed on the wafer W, and a rotation driving unit 16 for rotating the wafer W.

A description will be given of the construction of the centering unit 12. As shown in FIG. 1, a pair of first guide rails 20 is arranged on a base plate 18 in the horizontal direction. Cramp arms 22A, 22B are slidably supported on the first guide rails 20 via slide members (not shown).

Racks 24A, 24B are secured to the cramp arms 22A, 22B, and the racks 24A, 24B are engaged with a pinion 26 which is rotatably supported on the base plate 18. The cramp arms 22A, 22B move symmetrically with respect to a reference line L in FIG. 1 by the operation of the pinion 26 and the racks 24A, 24B.

The cramp arms 22A, 22B are connected to one another by a spring 28, and they are forced by the operation of the spring 28 in a direction to become closer to one another.

A first cylinder 30 is arranged on the base plate 18 in a direction in which the first guide rails 20 are arranged. A rod of the first cylinder 30 expands and contracts in the direction in which the first guide rails 20 are arranged, thereby pressing a push plate 32 which is attached to the cramp arm 22B (at the right side in FIG. 1).

When the rod of the first cylinder 30 presses the push plate 32, the cramp arm 22B moves to the right in FIG. 1. Consequently, the cramp arms 22A, 22B move by the same amount in a direction to become farther from one another, so that the distance between the cramp arms 22A, 22B becomes longer.

On the other hand, if the rod of the first cylinder 20 contracts from the state of pressing the push plate 32, the cramp arms 22A, 22B are moved by the same amount due to the operation of the spring 28 in a direction to become closer to one another, and thus, the distance between the cramp arms 22A and 22B becomes shorter.

As stated above, the distance between the cramp arms 22A, 22B can become longer and shorter due to the operation of the first cylinder 30.

Four cramp rollers 34A, 34B, 34B, 34B are rotatably supported at both ends of the cramps arms 22A, 22B via bearings (not shown). The four cramp rollers 34A, 34A, 34B, 34B are arranged at equal distance from a reference point O on the reference line L, that is, they are arranged on a circle of which center is at the reference point O. The expansion and contraction of the cramp arms 22A, 22B results in the expansion and contraction of the cramp rollers 34A, 34B while the cramp rollers 34A, 34B are kept on the circles of which centers are at the reference point O.

The centering unit 12, which is constructed in the above-mentioned manner, positions the center of the wafer W at the reference point O when the movable cramp rollers 34A, 34B cramp the wafer W.

A description will be given of the construction of the positioning unit 14. A pair of second guide rails 36 is arranged along the reference line L at the upper side of the base plate 18 as shown in FIG. 1. A notch pin slider 38 is slidably supported on the second guide rails 36 via slide members (not shown).

A notch pin 40 is rotatably supported at the lower side of the notch pin slider 38. The sliding of the notch pin slider 38 moves the notch pin 40 on the reference line L.

One end of a spring 44 is connected to the notch pin slider 38 via a connecting member 42, and the other end of the spring 44 is connected to a supporting member 46 which is provided on the base plate 18. The notch pin slider 38 is always forced in a direction to become closer to the reference point O by the operation of the spring 44.

A second cylinder 46 is provided in proximity to the second guide rails 36. The rod of the second cylinder 48 expands and contracts in a direction in which the second guide rails 36 are arranged, thereby pressing a push plate 50 which is attached to the notch pin slider 38. When the rod of the second cylinder 48 presses the push plate 50, the notch pin 40 moves on the reference line L in a direction to become farther from the reference point O.

When the rod of the second cylinder 48 expands, the notch pin 40 of the notch positioning unit 14 moves on the reference line L in a direction to become farther from the reference point O. When the rod of the second cylinder 48 contracts, the notch pin 40 of the notch positioning unit 14 moves on the reference line L in a direction to become closer to the reference point O. The notch pin 40 fits into the notch N formed on the wafer W, so that the notch N of the wafer W can be positioned in a predetermined reference direction, that is, on the reference line L.

A description will be given of the construction of the rotation driving unit 16. A pair of third guide rails 52 is arranged at the lower part in the drawing of the base plate 18 along the reference line L. A roller slider 54 is slidably supported on the third guide rails 52 via slide members (not shown).

A rotary roller 56 is rotatably supported at the lower side of the roller slider 54 via a bearing (not shown). A motor 58 is provided at the upper side of the roller slider 54 and it is rotatable forward and backward. The spindle of the motor 58 is connected to the shaft of the rotary roller 56. Driving the motor 58 results in the rotation of the rotary roller 56.

The roller slider 54 is connected to one end of a spring 62 via a connecting member 60, and the other end of the spring 62 is connected to a supporting member 64 which is provided on the base plate 18. The roller slider 54 is forced in a direction to become closer to the reference point O by the operation of the spring 62.

A third cylinder 66 is provided in proximity to the third guide rails 52. A rod of the third cylinder 66 expands and contracts in a direction in which the third guide rails 52 are arranged. The rod of the third cylinder 66 expands to press a push plate 68, which is attached to the roller slider 54. If the push plate 68 is pressed by the rod of the third cylinder 66, the rotary roller 56 moves on the reference line L in a direction to become farther from the reference point O.

When the rod of the third cylinder 66 expands, the rotary roller 56 of the rotation driving unit 16 moves on the reference line L in a direction to become farther from the reference point O. When the rod of the third cylinder 66 contracts, the rotary roller 56 moves on the reference line L in a direction to become closer to the reference point O. The rotary roller 56 is pressed against the peripheral edge of the wafer W, which is cramped by the cramp rollers 34A, 34B, and the rotary roller 56 is rotated so that the wafer W can rotate about the reference point O.

Since the wafer W is cramped by the rotatably-supported cramp rollers 34A, 34B, the wafer W is able to rotate freely even when it is cramped by the cramp rollers 34A, 34B.

A description will be given of the operation of the first embodiment of the wafer positioning apparatus according to the present invention, which is constructed in the above-mentioned manner.

First, the first cylinder 30 is driven to expand the rod thereof, and the rod of the first cylinder 30 presses the push plate 32, which is attached to the cramp arm 22B. Thereby, the cramp arms 22A, 22B move by equal amount in a direction to become farther from the reference point O. With the movement of the cramp arms 22A, 22B, the cramp rollers 34A, 34B move by equal amount in a direction to become farther from the reference point O.

At the same time as the first cylinder 30 is driven, the second cylinder 48 and the third cylinder 66 are driven, and the rods of the second cylinder 48 and the third cylinder 66 expand to press the push plates 50, 68. Thus, the notch pin 40 and the rotary roller 56 move in a direction to become farther from the reference point O.

When the distance between the cramp rollers 34A, 34B reaches the maximum after moving in a direction to become farther from the reference point O, the wafer W is set between the cramp rollers 34A, 34B.

After the wafer W is set between the cramp rollers 34A, 34B, the expanded rod of the first cylinder 30 contracts. Thereby, the cramp arms 22A, 22B move in a direction to become closer to one another by the operation of the spring 28. With this movement, the cramp rollers 34A, 34B move towards the reference point O.

As the cramp rollers 34A, 34B move towards the reference point O, the peripheral edge of the wafer W meets the cramp rollers 34A, 34B. The cramp rollers 34A, 34B move towards the reference point O while they press the peripheral edge of the wafer W.

The cramp rollers 34A, 34B stop when all cramp rollers 34A, 34B are pressed against the peripheral edge of the wafer W. Thus, the cramp rollers 34A, 34B cramp the wafer W. The cramp rollers 34A, 34B are moving while they are kept on the circles of which centers are at the reference point O. Then, if the wafer W is cramped in contact with the four cramp rollers 34A, 34A, 34B, 34B, the center of the wafer W corresponds to the reference point O. Thus, the wafer W can be centered.

When the wafer W is centered as stated above, the rods of the second cylinder 48 and the third cylinder 66 contract. Then, the notch pin 40 and the rotary roller 56 move toward the reference point O due to tensile forces of the springs 44, 62. Thereby, the notch pin 40 and the rotary roller 56 are pressed against the peripheral edge of the wafer W which is cramped by the cramp rollers 34A, 34B.

Figure 2A:
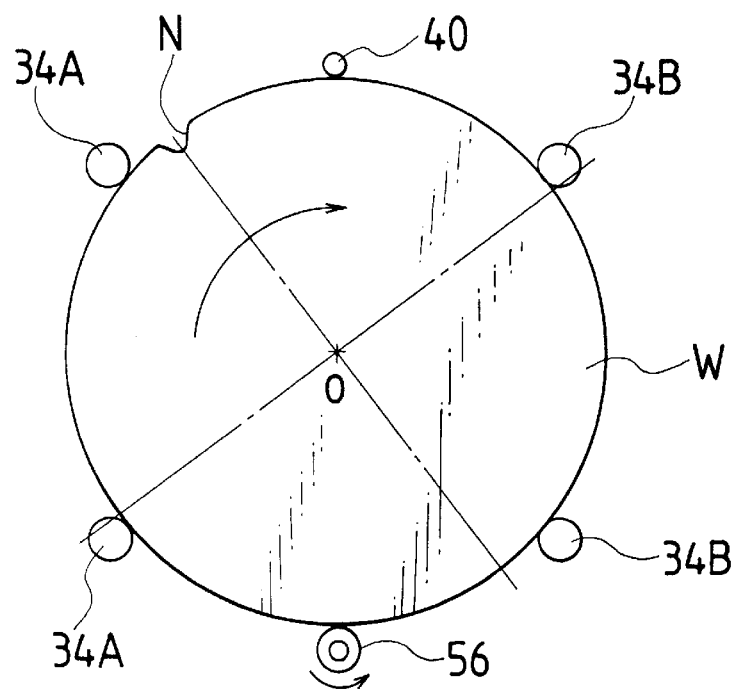
FIGS. 2(a) and 2(b) are views of assistance in explaining the operation of the first embodiment of the wafer positioning apparatus according the present invention.
Figure 2B:
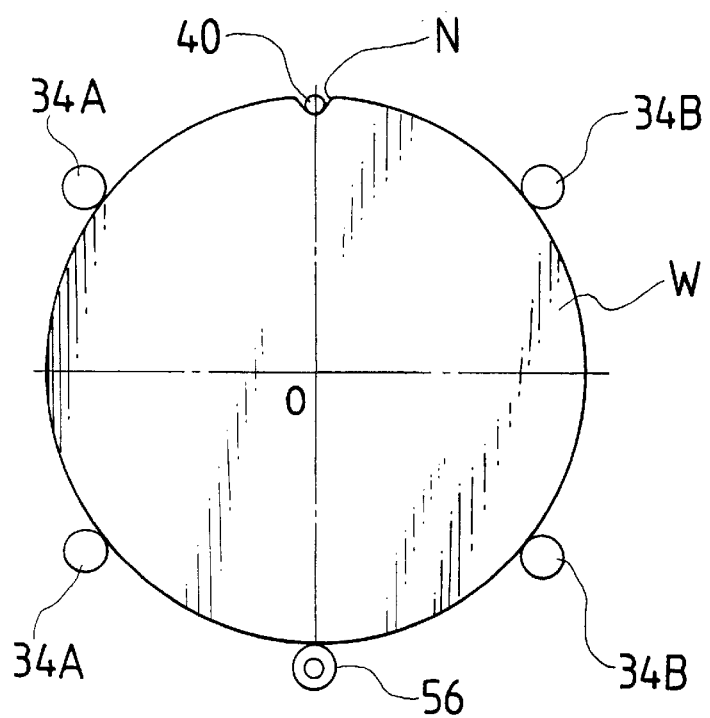

FIG. 2(*a*) shows the state where the notch pin 40 and the rotary roller 56 are pressed against the peripheral edge of the wafer W which is cramped by the cramp rollers 34A, 34B.

Unlike a conventional method, the notch N is not set in the direction of the notch pin 40 before the wafer W is centered. Then, even if the notch pin 40 is pressed against the wafer W which is cramped by the cramp rollers 34A, 34B, the notch pin 40 does not fit into the notch N as shown in FIG. 2(*a*) (the wafer W may accidentally be cramped by the cramp rollers 34A, 34B in such a state that the direction of the notch N corresponds to that of the notch pin 40.)

In this case, the wafer W is rotated to thereby move the notch N toward the notch pin 40, so that the notch pin 40 can fit into the notch N. Thereby, the center of the wafer W corresponds to the reference point O, and the direction of the notch N corresponds to a predetermined reference direction (parallel to the reference line L).

The wafer W is rotated as described below.

As stated above, when the rods of the second cylinder 48 and the third cylinder 66 contract, the notch pin 40 and the rotary roller 56 are pressed against the peripheral edge of the wafer W which is cramped by the cramp rollers 34A, 34B.

Then, the motor 58, which connects to the rotary roller 56, is driven while the rotary roller 56 is pressed against the peripheral edge of the wafer W. Driving the motor 58 results in the rotation of the rotary roller 56, and the rotation is transmitted to the wafer W, which rotates about the reference point O.

The rotation of the wafer W moves the notch N of the wafer W. When the notch N reaches the notch pin 40, the notch pin 40, which is pressed against the wafer W, fits into the notch N as shown in FIG. 2(*b*), and the wafer W is positioned.

When the notch pin 40 fits in the notch N, the wafer W stops rotating, and then, the motor 58 is stopped.

As stated above, according to the wafer positioning apparatus of the present invention, there is no necessity to set the direction of the notch N before the wafer W is mounted in the positioning apparatus, and therefore, the positioning be efficiently performed.

Moreover, since the notch can be positioned correctly, the wafer can accurately be chamfered, and it is possible to prevent the appearance of defective wafers.

Figure 3:
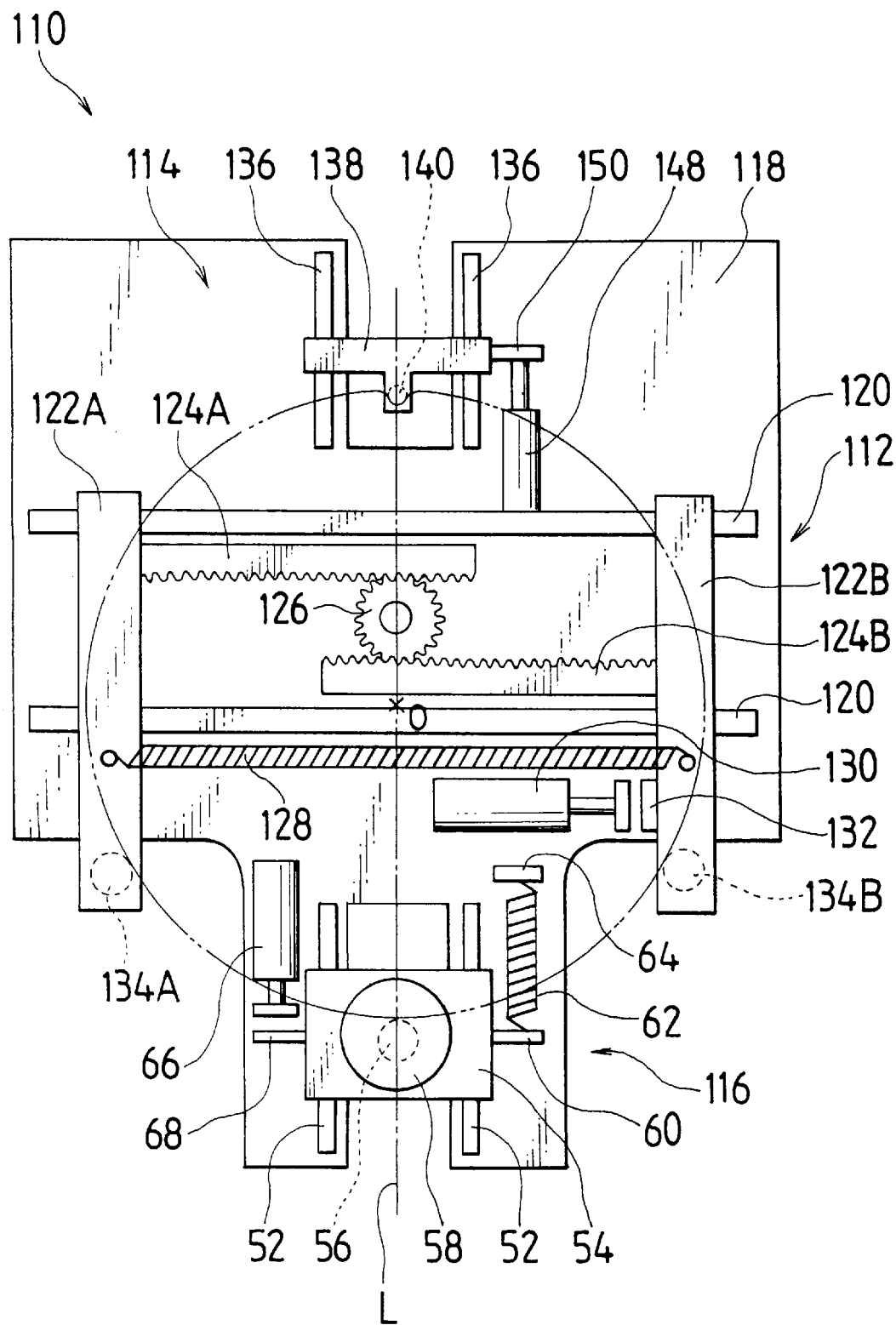
FIG. 3 is a plan view of the second embodiment of the wafer positioning apparatus according to the present invention.

FIG. 3 is a plan view illustrating the construction of the second embodiment of the wafer positioning apparatus according to the present invention.

As shown in FIG. 3, the wafer positioning apparatus 110 comprises a wafer supporting unit 112 for supporting the wafer W, a notch positioning unit 114 for positioning the notch N formed on the wafer W, and a rotation driving unit 116 for rotating the wafer W.

A description will be given of the construction of the wafer supporting unit 112. As shown in FIG. 3, a pair of guide rails 120 is arranged on a base plate 118 in a horizontal direction. Cramp arms 122A, 122B are slidably supported on the guide rails 120 via slide members (not shown).

Racks 124A, 124B are secured to the cramp arms 122A, 122B, and they are engaged with a pinion 126. The cramp arms 122A, 122B move symmetrically with respect to a reference line L in FIG. 3 due to the operation of the pinion 126 and the racks 124A, 124B.

The cramp arms 122A, 122B are connected to one another by a spring 128, and they are forced by the operation of the spring 128 in a direction to become closer to one another.

A first cylinder 130 is arranged on the base plate 118 along the guide rails 120. A rod of the first cylinder 130 expands and contracts along the first guide rails 120, and it expands to press a push plate 132 which is attached to the cramp arm 122B (at the right side in FIG. 3). The distance between the cramp arms 122A, 122B can freely be changed by expanding and contracting the rod of the first cylinder 130.

Cramp rollers 134A, 134B are rotatably supported at the lower end of the cramp arms 122A, 122B via bearings (not shown). The cramp rollers 134A, 134B are arranged at equal distance from the reference line L, and the expansion and contraction of the cramp rollers 122A, 122B result in the expansion and contraction of the cramp rollers 134A, 134B by the same amount.

A description will be given of the construction of the notch positioning unit 114.

A pair of second guide rails 136 is arranged along the reference line L at the upper side of the base plate 118. A notch pin slider 138 is slidably supported on the second guide rails 136 via slide members (not shown).

A notch pin 140 is rotatably supported at the lower side of the notch pin slider 138, and the sliding of the notch pin slider 138 moves the notch pin 140 on the reference line L.

A second cylinder 146 is provided in proximity to the second guide rails 136, and a rod of the second cylinder 148 is connected to the notch pin slider 138 via a connecting member 150.

When the rod of the second cylinder 148 expands, the notch pin 140 of the notch positioning unit 114 moves on the reference line L from a notch reference position to a waiting position. When the rod of the second cylinder 148 contracts, the notch pin 140 moves on the reference line L from the waiting position to the notch reference position.

The notch pin 140 which is positioned at the notch reference position fits into the notch N on the wafer W, so that the notch N can be positioned at a predetermined reference position in a predetermined reference direction.

The rotation driving unit 116 is arranged at such a position as to face the wafer supporting unit 112, and it is constructed in the same manner as the rotation driving unit 16 in the first embodiment. Hence, parts similar to those of the rotation driving unit 16 in the first embodiment are denoted by the same reference numerals, and a description will not be given of them.

A description will be given of the operation of the second embodiment of the wafer positioning apparatus according to the present invention, which is constructed in the above-mentioned manner.

First, the first cylinder 130, the second cylinder 148 and the third cylinder 66 are driven to expand the rods thereof.

Thereby, the cramp rollers 134A, 134B and the rotary roller 56 move in a direction to become farther from one another, and the distance between them becomes longer. The notch pin 140 moves on the reference line L from the notch reference position to the waiting position.

Then, the wafer W is set among the cramp rollers 134A, 134B and the notch pin 140. After the wafer W is set, the expanded rod of the second cylinder 148 contracts. Thereby, the notch pin 140 moves on the reference line L to the notch reference position.

After the second cylinder 148 contracts, the first cylinder 130 contracts. Thereby, the cramp rollers 134A, 134B move in a direction to become closer to one another.

The cramp rollers 134A, 134B move in a direction to become closer to one another, while they are pressing the peripheral edge of the wafer W. Thus, the peripheral edge of the wafer W meets the notch pin 140 which is located at the notch reference position. Consequently, the wafer W is cramped by the notch pin 140 and the cramp rollers 134A, 134B.

Since the cramp rollers 134A, 134B move symmetrically with respect to the reference line L, the center of the wafer W is positioned on the reference line L when the wafer W is cramped by the cramp rollers 134A, 134B and the notch pin 140.

When the wafer W is cramped as stated above, the rod of the third cylinder 66 contracts. Then, the rotary roller 56 is pressed against the peripheral edge of the wafer W which is cramped by the cramp rollers 134A, 134B and the notch pin 140.

FIG. 4(a) shows the state where the rotary roller 56 is pressed against the peripheral edge of the wafer W which is cramped by the cramp roller 134A, 134B and the notch pin 140.

The notch N of the wafer W is not set in the direction of the notch pin 140 before the wafer W is cramped by the cramp rollers 134A, 134B and the notch pin 140. For this reason, when the wafer W is cramped by the cramp rollers 134A, 134B and the notch pin 140, the notch pin 140 hardly fits into the notch N.

In this case, the wafer W is rotated in a state of being cramped by the cramp rollers 134A, 134B and the notch pin 140, so that the notch pin 140 can fit into the notch N. Thereby, the notch N is positioned at the predetermined notch reference position in the predetermined reference direction (which is parallel to the reference line L).

Just as in the first embodiment, the wafer W is rotated by rotating the rotary roller 56 which is pressed against the wafer W.

Specifically, driving the motor 58, which connects to the rotary roller 56, results in the rotation of the rotary roller 56, and the rotation is transmitted to the wafer W so that the wafer W can rotate. At this time, the wafer W rotates about the center of the circle which is inscribed with the notch pin 140 and the cramp rollers 134A, 134B.

The notch N formed on the wafer W moves with the rotation of the wafer W. Consequently, the notch pin 140 which is located at the notch reference position fits into the notch N as shown in FIG. 4(b).

When the notch N is coupled with the notch pin 140 which is located at the notch reference position, the notch N is positioned at the predetermined notch reference position. Since the wafer W rotates with the center thereof on the reference line L, the notch N is positioned in the predetermined reference direction when the notch N is coupled with the notch pin 140.

When the notch pin 40 fits in the notch N, the wafer W stops rotating, and then, the motor 58 is stopped.

As stated above, according to the wafer positioning apparatus of this embodiment, there is no necessity to set the direction of the notch N before the wafer W is mounted in the positioning apparatus. Thereby, it is possible to efficiently position the wafer W.

In this embodiment, since the wafer W is positioned with the notch N being the reference, the notch N can accurately be chamfered.

In other words, in the slicing process, if the ingot is tilted in order to find a crystal orientation of the ingot and sliced, the ingot is sliced into oval-shaped wafers. For this reason, the depth of the notch varies according to the sliced ingot. In this embodiment, however, the wafer W is positioned with the notch N being the reference so as to fix the distance between the notch and the notch grinding tool, so that the notch can accurately be chamfered.

In this embodiment, the notch pin 140 is movable between the notch reference position and the waiting position in order to make the wafer setting more convenient. However, the notch pin 140 may be fixed at the notch reference position.

The wafer positioning apparatus according to the first and second embodiments may be used in combination with the pre-alignment apparatus as is the conventional wafer positioning apparatus. In this case, the wafer W is mounted on the wafer positioning apparatus in such a state that the notch N is positioned in the direction of the notch pin 40 (140). Hence, even if the wafer rotates when it is mounted on the wafer positioning apparatus, the notch N would be displaced only a little, and the notch N corresponds to the notch pin 40 (140) by rotating the wafer W a little. Thereby, it is possible to position the wafer W within a short period of time.

After the wafer W is positioned by the wafer positioning apparatus, it is preferably transferred to the wafer table as described below.

When the wafer table is positioned at a predetermined reference position, the center of the wafer table corresponds to the reference point of the wafer positioning apparatus, which is placed over the wafer table and is vertically movable. The wafer positioning apparatus receives the wafer W, which is transported by the transport apparatus, over the wafer table, and it positions the wafer W in the above-mentioned procedure. Then, the wafer positioning apparatus is lowered in order to transfer the wafer to the wafer table.

Otherwise, the wafer positioning apparatus may be incorporated in the transport apparatus which transports the wafer W to the wafer table, so that the wafer W can be positioned during transportation. In this case, the reference point of the wafer positioning apparatus must correspond to the center of the wafer table when the wafer W is transferred to the wafer table.

Moreover, in these embodiments, the rotary roller 56 is employed as the mechanism which rotates the wafer W, but the present invention should not be restricted to this. For instance, a motor may be connected to the cramp rollers 34A, 34B (134A, 134B) which cramp the wafer W, and the motor rotates. Then, the wafer W is rotated by the motor. Thereby, the apparatus can be more compact.

Furthermore, the wafer positioning apparatus of these embodiments may be applied to not only the wafer chamfering apparatus but also all kinds of equipment which must position the wafer (e.g. a wafer plane grinding apparatus, a wafer lapping apparatus and a wafer polishing apparatus).

As set forth hereinabove, according to the present invention, the wafer can correctly be positioned without positioning the notch of the wafer in advance.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A wafer positioning apparatus for positioning a wafer such that the center of the wafer is at a predetermined reference point and a notch, formed on the wafer, is in a predetermined reference direction, said wafer positioning apparatus comprising:

a plurality of cramp rollers arranged on a circle of which center is at the reference point, said plurality of cramp rollers being movable for cramping the wafer to position the center of the wafer at the reference point;

a notch pin arranged in the reference direction and being capable of moving forward and backward with respect to the reference point, said notch pin fitting into the notch of the wafer to position the notch in the reference direction;

a rotary roller being capable of moving forward and backward with respect to the reference point, said rotary roller rotating in a state of being pressed against the peripheral edge of the wafer to rotate the wafer;

a motor for rotating said rotary roller; and wherein said rotary roller rotates the wafer cramped by said plurality of cramp rollers, so that said notch pin fits into the notch of the wafer to thereby position the wafer.

\* \* \* \* \*